United States Patent
Zini et al.

(10) Patent No.: US 10,411,155 B2
(45) Date of Patent: Sep. 10, 2019

(54) METHOD OF PRODUCING OPTOELECTRONIC SEMICONDUCTOR CHIPS

(71) Applicant: OSRAM Opto Semiconductors GmbH, Regensburg (DE)

(72) Inventors: Lorenzo Zini, Regensburg (DE); Alexander Frey, Lappersdorf (DE); Joachim Hertkorn, Wörth an der Donau (DE); Berthold Hahn, Hemau (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 4 days.

(21) Appl. No.: 15/327,697

(22) PCT Filed: Jul. 23, 2015

(86) PCT No.: PCT/EP2015/066919
§ 371 (c)(1),
(2) Date: Jan. 20, 2017

(87) PCT Pub. No.: WO2016/016098
PCT Pub. Date: Feb. 4, 2016

(65) Prior Publication Data
US 2017/0207363 A1    Jul. 20, 2017

(30) Foreign Application Priority Data

Jul. 31, 2014  (DE) .................... 10 2014 110 884

(51) Int. Cl.
*H01L 33/00* (2010.01)
*H01L 33/32* (2010.01)
(Continued)

(52) U.S. Cl.
CPC .......... *H01L 33/0079* (2013.01); *H01L 33/32* (2013.01); *H01L 33/62* (2013.01);
(Continued)

(58) Field of Classification Search
CPC ................. H01L 24/98; H01L 21/6835; H01L 2221/68304;
(Continued)

(56) References Cited

U.S. PATENT DOCUMENTS

2010/0078672 A1*  4/2010  Moriyama .......... H01L 33/0079
                                                            257/103
2010/0117115 A1*  5/2010  Tanaka ................ H01L 33/0079
                                                            257/103
(Continued)

FOREIGN PATENT DOCUMENTS

DE   10 2007 019 775 A1   10/2008
DE   10 2007 043 902 A1   3/2009
(Continued)

*Primary Examiner* — Zandra V Smith
*Assistant Examiner* — Jeremy J Joy
(74) *Attorney, Agent, or Firm* — DLA Piper LLP (US)

(57) ABSTRACT

A method of producing optoelectronic semiconductor chips includes growing a semiconductor layer sequence on a growth substrate; applying at least one metallization to a contact side of the semiconductor layer sequence, which contact side faces away from the growth substrate; attaching an intermediate carrier to the semiconductor layer sequence, wherein a sacrificial layer is attached between the intermediate carrier and the semiconductor layer sequence; removing the growth substrate from the semiconductor layer sequence; structuring the semiconductor layer sequence into individual chip regions; at least partially dissolving the sacrificial layer; and subsequently removing the intermediate carrier, wherein, in removing the intermediate carrier, part of the sacrificial layer is still present, removing the intermediate carrier includes mechanically breaking remain- (Continued)

ing regions of the sacrificial layer, and the sacrificial layer is completely removed after removing the intermediate carrier.

13 Claims, 4 Drawing Sheets

(51) Int. Cl.
*H01L 33/62* (2010.01)
*H01S 5/02* (2006.01)
(52) U.S. Cl.
CPC .... *H01S 5/0217* (2013.01); *H01L 2933/0066* (2013.01); *H01S 5/0201* (2013.01)
(58) Field of Classification Search
CPC ............ H01L 2221/68318–2221/68322; H01L 2221/68327; H01L 2221/68368; H01L 33/0079; H01L 2221/68381
See application file for complete search history.

(56) References Cited

U.S. PATENT DOCUMENTS

| | | | |
|---|---|---|---|
| 2010/0151609 A1* | 6/2010 | Kim | H01L 33/0079 438/33 |
| 2010/0317132 A1 | 12/2010 | Rogers et al. | |
| 2011/0198648 A1 | 8/2011 | Jung | |
| 2014/0084240 A1* | 3/2014 | Hu | H01L 25/0753 257/13 |
| 2014/0084482 A1* | 3/2014 | Hu | H01L 24/06 257/774 |
| 2014/0159065 A1* | 6/2014 | Hu | H01L 33/0079 257/88 |
| 2014/0159066 A1* | 6/2014 | Hu | H01L 25/0753 257/88 |
| 2015/0021624 A1* | 1/2015 | Meyer | H01L 21/76256 257/77 |
| 2015/0090956 A1* | 4/2015 | Coones | H01L 21/76251 257/14 |
| 2015/0187991 A1* | 7/2015 | McGroddy | H01L 27/016 257/13 |
| 2015/0228862 A1* | 8/2015 | Miyoshi | H01L 33/0079 257/98 |
| 2016/0163917 A1* | 6/2016 | Lu | H01L 33/0079 438/113 |

FOREIGN PATENT DOCUMENTS

| | | | | |
|---|---|---|---|---|
| WO | 2010/132552 A1 | 11/2010 | | |
| WO | WO 2010132552 A1 * | 11/2010 | ......... | H01L 25/0753 |
| WO | WO-2010132552 A1 * | 11/2010 | ......... | H01L 25/0753 |
| WO | 2014/046981 A1 | 3/2014 | | |

* cited by examiner

METHOD OF PRODUCING OPTOELECTRONIC SEMICONDUCTOR CHIPS

TECHNICAL FIELD

This disclosure relates to a method of producing optoelectronic semiconductor chips.

BACKGROUND

It could be helpful to provide a method of efficiently producing optoelectronic semiconductor chips that comprise no carrier and no growth substrate.

SUMMARY

We provide a method of producing optoelectronic semiconductor chips including growing a semiconductor layer sequence on a growth substrate, applying at least one metallization to a contact side of the semiconductor layer sequence, which contact side faces away from the growth substrate, attaching an intermediate carrier to the semiconductor layer sequence, wherein a sacrificial layer is attached between the intermediate carrier and the semiconductor layer sequence, removing the growth substrate from the semiconductor layer sequence, structuring the semiconductor layer sequence into individual chip regions, at least partially dissolving the sacrificial layer, and subsequently removing the intermediate carrier, wherein, in removing the intermediate carrier, part of the sacrificial layer is still present, removing the intermediate carrier includes mechanically breaking remaining regions of the sacrificial layer, and the sacrificial layer is completely removed after removing the intermediate carrier.

We also provide a method of producing optoelectronic semiconductor chips including growing a semiconductor layer sequence on a growth substrate, applying at least one metallization to a contact side of the semiconductor layer sequence, which contact side faces away from the growth substrate, attaching an intermediate carrier to the semiconductor layer sequence, wherein a sacrificial layer is attached between the intermediate carrier and the semiconductor layer sequence, removing the growth substrate from the semiconductor layer sequence, structuring the semiconductor layer sequence into individual chip regions, at least partially dissolving the sacrificial layer, and subsequently removing the intermediate carrier, wherein the intermediate carrier includes a plurality of elevations, the sacrificial layer is directly applied to the intermediate carrier, and the elevations are, immediately after applying the intermediate carrier to the semiconductor layer sequence, at least partially free of the sacrificial layer, viewed in plan view from a side of the semiconductor layer sequence.

We further provide a method of producing optoelectronic semiconductor chips including growing a semiconductor layer sequence on a growth substrate, applying at least one metallization to a contact side of the semiconductor layer sequence, which contact side faces away from the growth substrate, attaching an intermediate carrier to the semiconductor layer sequence, wherein a sacrificial layer is attached between the intermediate carrier and the semiconductor layer sequence so that the sacrificial layer is applied directly to an entire surface of the metallization facing away from the semiconductor layer sequence and so that the sacrificial layer is not in direct contact with the semiconductor layer sequence, removing the growth substrate from the semiconductor layer sequence, structuring the semiconductor layer sequence into individual chip regions, at least partially dissolving the sacrificial layer, and subsequently removing the intermediate carrier, wherein, the sacrificial layer can be etched selectively with respect to the metallization, in removing the intermediate carrier, part of the sacrificial layer is still present, removing the intermediate carrier includes mechanically breaking remaining regions of the sacrificial layer, and the sacrificial layer is completely removed after removing the intermediate carrier.

LIST OF REFERENCE NUMERALS 1 optoelectronic semiconductor chip
2 growth substrate
3 semiconductor layer sequence
33 chip region of the semiconductor layer sequence
34 contact side of the semiconductor layer sequence
4 metallization
45 fastening side of the metallization
5 sacrificial layer
57 barrier layer
58 etching agent
59 etching agent bath
6 intermediate carrier
63 elevation on intermediate carrier
7 solder layer
75 bottom side of solder layer
8 carrier film
9 electrical contact surface
95 cover material
t thickness of the sacrificial layer

DETAILED DESCRIPTION

Our method may comprise the step of growing a semiconductor layer sequence on a growth substrate. Depending on the semiconductor material of the semiconductor layer sequence, the growth substrate is, e.g., sapphire, silicon carbide, silicon, gallium arsenide or gallium phosphide.

The semiconductor layer sequence is preferably based on a III-V compound semiconductor material. The semiconductor material is, e.g., a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$, wherein $0 \leq n \leq 1$, $0 \leq m \leq 1$ and $n+m \leq 1$. The semiconductor layer sequence may comprise dopants as well as additional components. For the sake of simplicity, however, only the essential components of the crystal lattice of the semiconductor layer sequence, that means Al, As, Ga, In, N or P, are specified, although these may be partially replaced and/or supplemented by small amounts of further materials.

The semiconductor layer sequence may comprise at least one active zone that generates optoelectronic radiation in the completed semiconductor chip. The method then in particular produces light emitting diodes, laser diodes or photo diodes.

The method may comprise the step of applying one or more metallizations to a contact side of the semiconductor layer sequence, which contact side faces away from the growth substrate. The metallization is preferably adapted to serve as a current spreading and/or a current injection into the semiconductor layer sequence. Alternatively or additionally, the metallization may be a mirror for radiation generated in the semiconductor layer sequence when using the completed semiconductor chip. Preferably, the metallization comprises one or more partial layers made of metal.

An intermediate carrier may be attached to the semiconductor layer sequence. The intermediate carrier is preferably mechanically stable and mechanically rigid such that the intermediate carrier does not or does not significantly bend in the intended method of producing the semiconductor chips. In particular, the intermediate carrier extends in a contiguously and mechanically stable manner across the entire semiconductor layer sequence produced on the growth substrate.

A sacrificial layer may be attached between the intermediate carrier and the semiconductor layer sequence. The sacrificial layer is adapted to be partially or completely removed in the course of the subsequent production method. In particular, the sacrificial layer is not or is not to a significant extent present in the completed semiconductor chip. In particular, the sacrificial layer serves as a temporary connecting layer between the intermediate carrier and the semiconductor layer sequence, wherein the sacrificial layer is preferably not in direct contact with the semiconductor layer sequence. The intermediate carrier is, during the production method, temporarily mechanically fixed to the semiconductor layer sequence via the sacrificial layer.

The method may comprise the step of removing the growth substrate from the semiconductor layer sequence. This method step is preferably only performed after the intermediate carrier has been attached to the semiconductor layer sequence. Removal of the growth substrate can, e.g., be a laser lift-off process.

The method may comprise the step of structuring the semiconductor layer sequence into individual chip regions. Preferably, each of the chip regions is dedicated to exactly one of the semiconductor chips. It is, however, also possible to provide multiple chip regions for one single semiconductor chip and have these individual chip regions adapted as an electronic series circuit.

The intermediate carrier may be removed. Before and/or while removing the intermediate carrier, the sacrificial layer is partially or completely dissolved. By dissolving the sacrificial layer at least partially, an adhesion between the intermediate carrier and the semiconductor layer sequence is reduced to allow for a subsequent removal of the intermediate carrier, in particular mechanically. Preferably, the sacrificial layer is not dissolved in a way that the adhesion between the intermediate carrier and the semiconductor layer sequence totally disappears only due to the intended, e.g., chemical dissolving of the sacrificial layer. In other words, the intermediate carrier still adheres to the semiconductor layer sequence after the step of at least partially dissolving the sacrificial layer.

The method may produce an optoelectronic semiconductor chip such as a light emitting diode and the method may comprise at least the following steps, preferably in the specified order:

growing a semiconductor layer sequence on a growth substrate, applying at least one metallization to a contact side of the semiconductor layer sequence, which contact side faces away from the growth substrate, attaching an intermediate carrier to the semiconductor layer sequence, wherein a sacrificial layer is attached between the intermediate carrier and the semiconductor layer sequence in or prior to this step, removing the growth substrate from the semiconductor layer sequence, structuring the semiconductor layer sequence into individual chip regions, at least partially dissolving the sacrificial layer, and removing the intermediate carrier.

To produce substrate-free and carrier-free semiconductor chips such as light emitting diode chips, abbreviated LED chips, thermally removable carrier release films are often employed. When attached to such films, the individual semiconductor chips can be further processed without the growth substrate. However, employment of such films limits the further chemical or thermal processing of the semiconductor chip because such films are typically based on polymers and are therefore only to a limited extent chemically and thermally stable.

In the method described herein, a sacrificial layer is attached between a semiconductor layer sequence and a carrier substrate. Removal of the sacrificial layer allows for the mechanical separation of the semiconductor chips from the carrier substrate with a significantly reduced force. On the other side, omission of a thermally removable carrier film allows for performance of process steps on the semiconductor layer sequence on the intermediate carrier.

The intermediate carrier may be temperature-resistant and chemically resistant. Temperature-resistant may mean that the intermediate carrier can be permanently used up to a temperature of at least 400° C. or 500° C. or 600° C. without experiencing long-term damage or having its period of use significantly reduced. The intermediate carrier is, e.g., an inorganic carrier, e.g., made of a semiconductor material such as silicon or germanium, or a metallic carrier, e.g., made of a molybdenum alloy.

The sacrificial layer may be applied in a structured manner or is structured after being applied such as to produce predetermined breaking points and/or removal points. Such predetermined breaking points and/or removal points allow the individual to take semiconductor chips off the carrier by mechanical breaking. In doing so, it is possible to etch the sacrificial layer only partially such that relatively small connecting points remain between the semiconductor layer sequence and the intermediate carrier. The semiconductor chips and/or chip regions as well as the semiconductor layer sequence can be stabilized on the intermediate carrier by such connecting points or removal points. When lifting the semiconductor chips and/or chip regions off the intermediate carrier, these connecting points may then be broken or removed and/or weakened by a further etching step.

The sacrificial layer can be removed residue-free. In particular when using organic thermal release films, organic residue, in particular residue containing carbon, remains on the semiconductor chips and/or chip regions. Such residue may lead to a contamination of electric contact points and thus reduce the reliability in attaching the completed semiconductor chips to an external carrier such as a printed circuit board. In particular, carbon residue can be avoided by using an inorganic carbon-free sacrificial layer.

The relative positions of the semiconductor chip and/or chip regions may not change with respect to each other until the intermediate carrier is removed. In other words, the individual chip regions may not subsequently shift or twist relative to each other. This allows for achievement of a higher level of precision during manufacturing.

The sacrificial layer may be applied to the entire surface of the semiconductor layer sequence. That means, viewed in projection onto the semiconductor layer sequence, the semiconductor layer sequence is then completely covered by the sacrificial layer. This may also be true for all other layers applied to the semiconductor layer sequence.

The sacrificial layer may be directly applied to the metallization. The metallization is then in direct physical contact with the sacrificial layer. The sacrificial layer may be applied to the entire surface or only to parts of the metallization.

The sacrificial layer can be selectively etched relative to the metallization. This means, e.g., that an etching rate of the sacrificial layer relative to the metallization is increased by at least a factor of 10 or 100 or 1000 or 10,000. In particular, the sacrificial layer is then dissolved by a dry chemical and/or wet chemical etching process.

The individual chip regions may, during the step of removing the intermediate carrier, be fastened to a temporary carrier film and/or a die handler. The carrier film is preferably only applied to one side of the semiconductor layer sequence facing away from the metallization such that the carrier film does not contact the metallization. Preferably, during the step of removing the intermediate carrier, the individual chip regions as well as the optoelectronic semiconductor chips are already almost or completely manufactured such that no further method steps are required. In particular, after the step of removing the intermediate carrier, no further layers have to be attached via chemical vapor phase deposition or epitaxy or evaporation onto the chip regions.

During the step of removing the intermediate carrier, part of the sacrificial layer may still be present. Part may mean that the sacrificial layer covers an area proportion of at most 25% or 10% or 5% or 1% or 0.5% of the semiconductor layer sequence, in plan view, when removing the intermediate carrier. Alternatively or additionally, this area proportion is at least 0.1% or 1% or 3% or 10%. This relatively small area coverage proportion of the sacrificial layer significantly reduces adhesion between the intermediate carrier and the semiconductor layer sequence such as to allow for mechanical removal, e.g., by breaking.

During the step of removing the intermediate carrier, or immediately prior to this step, parts of the sacrificial layer may not be reduced in thickness. In other words, the sacrificial layer is then still present locally as an intact layer, in particular in many island-shaped regions, which are separated from each other. This allows for stabilization of the semiconductor layer sequence on the intermediate carrier until the step of removing the intermediate carrier. For each chip region, there may be exactly one island-shaped region present.

The sacrificial layer may be completely removed after removing the intermediate carrier from the chip regions. The step of removing the remaining parts of the sacrificial layer is preferably performed while the chip regions are still fixed relative to each other, namely, e.g., by using the die handler or the temporary carrier film.

The intermediate carrier may comprise a plurality of elevations. A mean distance between the elevations is preferably smaller than a mean edge length of the completed semiconductor chips. For example, a mean distance between the elevations is at least by a factor of 2 or 4 or 6 or 10 smaller than a mean edge length of the completed semiconductor chips and/or chip regions. A lateral extension of the elevations is preferably at most 10% or 5% or 2% of the mean edge length of the completed semiconductor chips and/or chip regions. Corresponding lateral dimensions, when viewed in a plan view of the intermediate carrier, may alternatively or additionally also apply to the island-shaped regions of the sacrificial layer.

The sacrificial layer may be directly applied to the intermediate carrier. For example, the sacrificial layer is applied to the intermediate carrier by a chemical vapor phase deposition method. The sacrificial layer may be applied to the intermediate carrier before connecting the intermediate carrier to the semiconductor layer sequence, or simultaneously with the step of connecting the intermediate carrier to the semiconductor layer sequence. Alternatively, the sacrificial layer may be first produced on the semiconductor layer sequence before attaching the intermediate carrier.

The elevations may, immediately after the step of applying the intermediate carrier to the semiconductor layer sequence, be partially or completely-free of the sacrificial layer, viewed in a plan view from the side of the semiconductor layer sequence. In other words, the sacrificial layer does not extend or does not completely extend to the elevations then. A mean thickness of the sacrificial layer or a maximum thickness of the sacrificial layer may be smaller than a height of the elevations. In other words, the elevations may project from the sacrificial layer. Alternatively, the elevations may be flush with the sacrificial layer or the sacrificial layer may project from the elevations.

The elevations may be formed integrally with the intermediate carrier. For example, the intermediate carrier is then, by etching or mechanically removing material, structured such as to form the elevations.

The elevations may be formed from a material different from the material of the intermediate carrier. For example, the elevations are formed from islands of a further material. Preferably, the sacrificial layer can be selectively etched with respect to this further material such that the elevations are maintained when removing the sacrificial layer. This preferably applies to when the elevations are formed integrally with the intermediate carrier.

The sacrificial layer may be completely dissolved before the step of removing the intermediate carrier. That means, when removing the intermediate carrier, the sacrificial layer no longer contributes to a mechanical connection between the intermediate carrier and the semiconductor layer sequence.

A mechanical connection between the semiconductor layer sequence and the intermediate carrier may be established via the elevations, preferably only via the elevations after completely dissolving the sacrificial layer. This allows for removal of the intermediate carrier from the semiconductor layer sequence in a specifically controlled manner because a structure of the elevations can be adjusted independently of the sacrificial layer.

The intermediate carrier may be fastened to the semiconductor layer sequence by at least one solder layer. Preferably the sacrificial layer can selectively be etched with respect to the solder layer or with respect to at least one of the solder layers or with respect to all solder layers.

The sacrificial layer may be in direct contact with the solder layer or at least one of the solder layers or two of the solder layers having the sacrificial layer sandwiched therebetween. In other words, the sacrificial layer may directly abut on two solder layers arranged on opposite main sides of the sacrificial layer.

Electrical contact surfaces for externally electrically contacting the completed semiconductor chips may be arranged on a fastening side of the metallization, which side is remote from the semiconductor layer sequence. The fastening side is adapted to have the completed semiconductor chips be contacted electrically and/or mechanically via the fastening side, e.g., by soldering. In particular, the fastening side is adapted at least partially for surface mounting, also referred to as SMT.

The electrical contact surfaces or at least one electrical contact surface may be provided on a bottom side of the solder layer furthest away from the semiconductor layer sequence in the complete semiconductor chips. It is also possible that the solder layer and alternatively or additionally the metallization are structured into multiple regions, which may be electrically separated from each other. An electric contacting of the semiconductor layer sequence may in particular be adapted as shown in connection with FIGS. 1 to 3 of DE 10 2007 019 775 A1, wherein a carrier is omitted. The disclosure of DE '775 with respect to the contacting is incorporated herein by reference.

The sacrificial layer may only in some places be applied directly to the layer that forms the contact surfaces. The sacrificial layer may then in particular also be directly applied to parts of the solder layer or to parts of the metallization. However, the electrical contact surfaces are preferably partially or completely not directly covered by the sacrificial layer.

The electrical contact surfaces may be covered by a cover material prior to the step of applying the sacrificial layer. The cover material can prevent the electrical contact surfaces from being contaminated by a material of the sacrificial layer. For example, the cover material is formed by a photoresist which can be removed residue-free by ashing.

The sacrificial layer may be applied in a structured manner. The sacrificial layer then covers, viewed in projection onto the semiconductor layer sequence, the semiconductor layer sequence only partially. The extent to which the sacrificial layer covers the semiconductor layer sequence is, e.g., at least 5% or 10% or 40% or 60% and/or at most 80% or 50% or 30%. Preferably, the sacrificial layer is structured regularly and not only applied in a statistically distributed manner.

The sacrificial layer may have a thickness of at least 200 nm or 500 nm or 1 µm or 5 µm and/or at most 20 µm or 10 µm. Such a relatively thick sacrificial layer prevents solder from flowing out of the solder layer directly at the carrier substrate onto the electrical contact surfaces of the chip regions in particular when attaching the carrier substrate. In other words, the sacrificial layer, due to its thickness, thus serves as a kind of solder-stop layer.

Below, a method described herein is explained in further detail with reference to the drawings by examples. The same reference numerals refer to the same elements in the individual drawings. The drawings are, however, not all made to scale, individual elements may rather be represented in excessive size to allow for a better understanding.

FIG. 1 shows schematic method steps of producing optoelectronic semiconductor chips. According to FIG. 1A, an intermediate carrier 6 is provided with a solder layer 7. Further, a growth substrate 2 having a semiconductor layer sequence 3 epitaxially grown thereon is provided. A metallization 4 is applied to the semiconductor layer sequence 3 on a contact side 34 facing away from the growth substrate 2. A sacrificial layer 5 is provided on a fastening side 45 of the metallization 4, which contact side faces away from the growth substrate 2.

Figure 1A:
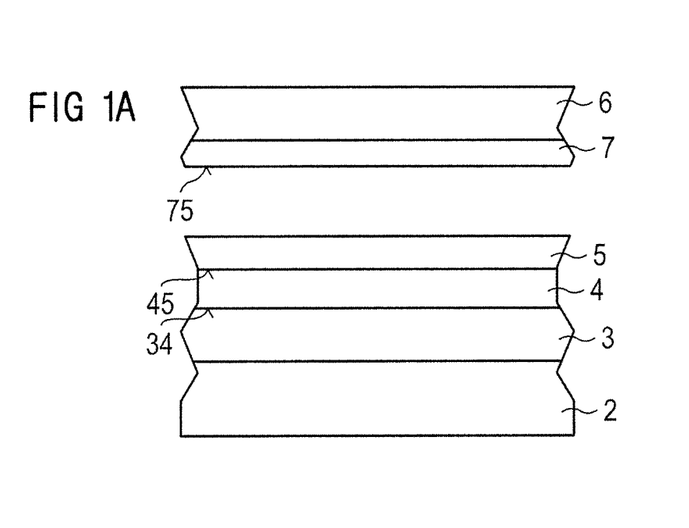
FIGS. 1A-1F and 2 to 5 show schematic sectional views of method steps of a method described herein of producing optoelectronic semiconductor chips.
Figure 1B:
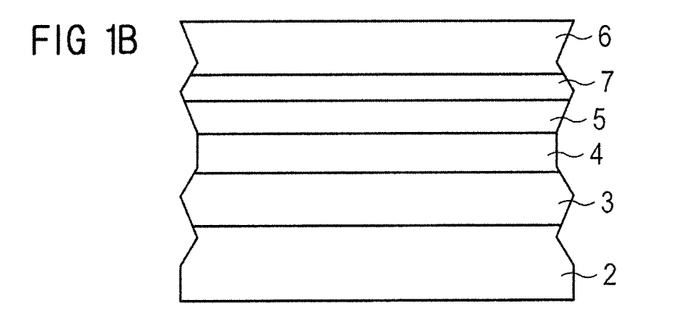

In the method step, as shown in FIG. 1B, the solder layer 7 connects to the sacrificial layer 5. Subsequently, in a step not shown, the growth substrate 2 is removed from the semiconductor layer sequence 3.

Other than shown in FIG. 1A, it is also possible to first apply a bottom side 75 of the solder layer 7, which side faces the semiconductor layer sequence 3, to the sacrificial layer 5 and to provide the intermediate carrier 6 separately without a solder layer 7. In other words, the solder layer 7 may then be located on the sacrificial layer 5 before attaching the intermediate carrier 6.

As in all other examples, the semiconductor layer sequence 3 is preferably based on AlInGaN and preferably comprises at least one active zone provided to generate radiation. In other words, the completed optoelectronic semiconductor chip is then in particular a light emitting diode.

The metallization 4 is preferably composed of multiple metal layers. For example, a thin platinum layer and/or titanium layer is arranged between the semiconductor layer sequence 3 and a metallic mirror layer of the metallization 4. The mirror layer is, e.g., made of aluminum or silver. Thickness of the overall metallization 4 is, e.g., at least 50 nm or 70 nm or 100 nm and/or at most 500 nm or 300 nm or 200 nm.

The sacrificial layer 5 is in particular made of a metal oxide such as zinc oxide. The sacrificial layer 5 may, e.g., have a thickness of at least 0.2 µm or 0.8 µm or 1.5 µm and/or at most 5 µm or 10 µm or 20 µm.

The solder layer 7 is, e.g., an AuSn solder or NiSn solder. Thickness of the solder layer 7 is preferably at least 1 µm or 2 µm or 5 µm and/or at most 20 µm or 10 µm or 5 µm. For example, an AuSn solder layer having a thickness of 2.7 µm or a NiSn solder layer having a thickness of 3.56 µm is used. These specifications may also apply to all solder layers in all other examples.

The individual layers 3, 4, 5, 7 are preferably applied to the entire surface of the growth substrate 2 as well as to the intermediate carrier 6. That means, the individual layers 3, 4, 5, 7 are then manufactured and applied to the growth substrate 2 and the intermediate carrier 6 in an unstructured and homogeneous manner.

Figure 1C:
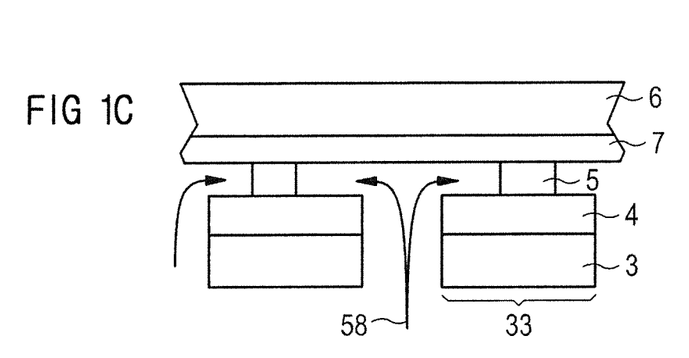

FIG. 1C shows that, after removing the growth substrate 2, the semiconductor layer sequence 3 and preferably also the metallization 4 are partitioned into individual chip regions 33. Each of the chip regions 33 is adapted for one of the completed optoelectronic semiconductor chips. It is possible that the semiconductor chips each comprise the semiconductor layer sequence 3 as a carrying component. Mean lateral dimensions of the semiconductor layer sequence 3, viewed in plan view of the intermediate carrier 6, are preferably at least 250 µm or 500 µm or 750 µm. The lateral dimensions of the completed semiconductor chips preferably deviate from the lateral dimensions of the chip regions by at most 10% or 3%.

For the sake of simplicity, method steps such as applying electric current distribution structures on a side of the semiconductor layer sequence 3 facing away from the intermediate carrier 6 or generating passivation layers on lateral surfaces of the semiconductor layer sequence 3 resulting from structuring it into the chip regions 33 are not shown in the drawings.

After structuring the semiconductor layer sequence 3 and the metallization 4, the sacrificial layer 5 is partially dissolved as shown in FIG. 1C. The sacrificial layer 5 is preferably dissolved by etching, which is performed selectively with respect to the metallization 4 and the solder layer 7. As mentioned above, the semiconductor layer sequence 3 may be provided with a not shown passivation layer such as silicon nitride.

The sacrificial layer 5 which is, e.g., a ZnO layer can selectively be etched by a gaseous etchant 58 such as hydrogen gas in FIG. 1C symbolized by arrows. The etching is stopped when island-shaped regions of the sacrificial layer 5 are formed between the chip regions 33 and the intermediate carrier 6. The chip regions 33 and the metallization 4 project from these island-shaped regions of the sacrificial layer 5 in a lateral direction, i.e., according to FIG. 1C, in a left-right direction. An extension of the island-shaped regions of the sacrificial layer 5 is, e.g., in the lateral direction at least 10% or 20% or 30% and/or at most 70% or 50% of a mean edge length of the chip regions 33. Even though the chip regions 33, due to the island-shaped regions of the sacrificial layer 5, still adhere to the intermediate carrier 6, these island-shaped regions can, however, be destroyed by breaking them in a controlled manner without destroying the chip regions 33.

Figure 1D:
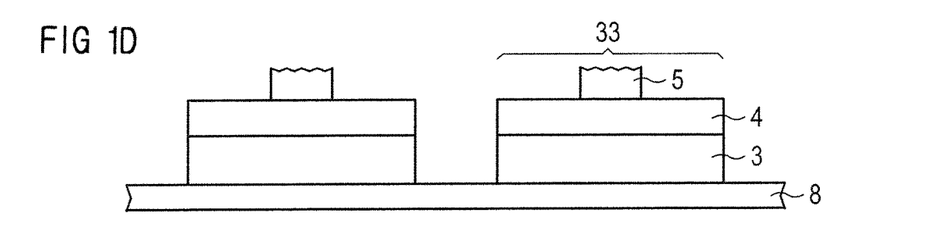

FIG. 1D shows that the intermediate carrier 6 with the solder layer 7 is broken off from the chip regions 33. The individual chip regions 33 are preferably attached to a carrier film 8 such that the individual chip regions 33 can be handled together. The carrier film 8 is no longer present on the completed semiconductor chips.

Figure 1E:
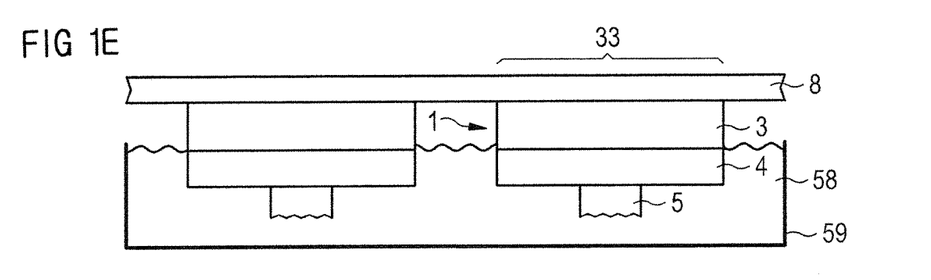
Figure 1F:
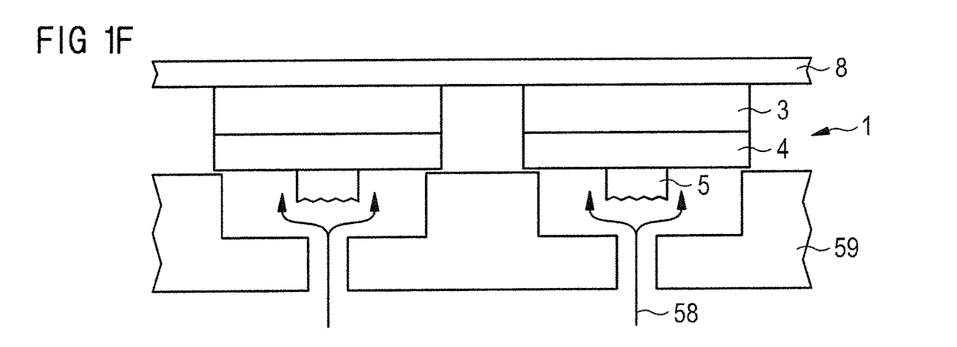

FIGS. 1E and 1F are alternative method steps of removing the remaining sacrificial layer 5. According to FIG. 1E, the chip areas 33 are exposed to a liquid etchant 58 in an etching agent bath 59. According to FIG. 1F, the sacrificial layer 5 is removed by a gas-like etchant 58, e.g., by hydrogen gas. Through the etching agent bath 59, e.g., the semiconductor layer sequence 3 and the carrier film 8 are protected from the etchant 58.

The complete removal of the sacrificial layer 5 yields the completed semiconductor chips 1. Alternatively, it is also possible that part of the sacrificial layer 5 remains on the semiconductor chips 1 such that the method steps according to FIG. 1E or 1F are not performed. For example, in an electrically conductive sacrificial layer 5, this can achieve an improved current spread.

Figure 2:
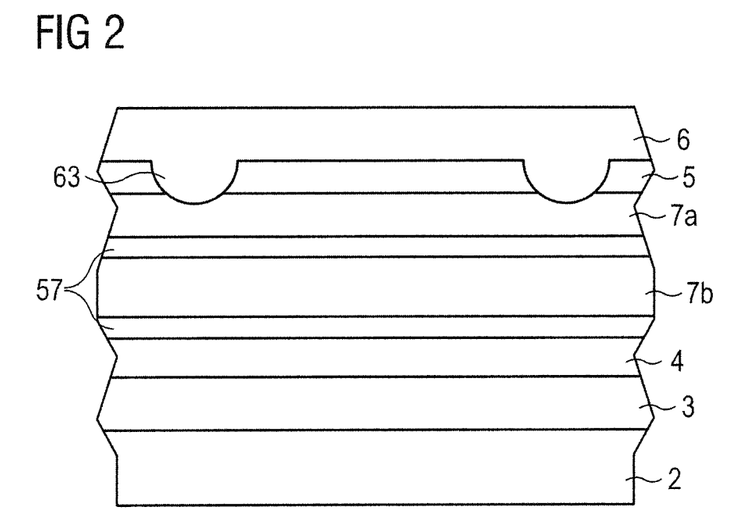

FIG. 2 shows another possibility of realizing a controlled removal with the sacrificial layer 5. The intermediate carrier 6 comprises multiple elevations 63, preferably multiple elevations per chip region not shown in FIG. 2. The sacrificial layer 5 is attached between the elevations 63, wherein the elevations 63 project from the sacrificial layer 5 or, other than shown, may also be flush with the sacrificial layer 5 in a direction perpendicular to the growth substrate 2.

The sacrificial layer 5 mechanically connects to the metallization 4 and the semiconductor layer sequence 3 via a first solder layer 7a and two barrier layers 57 as well as via a second solder layer 7b.

Such a structure of multiple solder layers 7a, 7b and the use of barrier layers 57 may also be provided in all other examples, in which the solder layers 7a, 7b may be made of different materials and comprise different processing temperatures. In particular, a processing temperature of the second solder layer 7b may be higher than a processing temperature of the first solder layer 7a. The two solder layers are, e.g., formed of an AuSn solder.

The barrier layers 57 may be layers that prevent a diffusion of solder material between the solder layers 7a, 7b and, in particular, a diffusion of solder material from the second solder layer 7b into the metallization 4. For example, the barrier layers 57 are made of a titanium alloy or a wolfram alloy, e.g., they are titanium wolfram nitride layers. The barrier layers 57 may also comprise platinum or consist of platinum.

To remove the intermediate carrier 6, the sacrificial layer 5 is completely removed. A mechanical connection between the intermediate carrier 6 and the semiconductor layer sequence 3 is then only given in a controlled manner via the elevations 63 such that the semiconductor layer sequence 3 only adheres to the intermediate carrier 6 in a few places.

The remaining method steps may be performed as shown in connection with FIG. 1. In particular, the growth substrate 2 is removed before dissolving the sacrificial layer 5. After dissolving the sacrificial layer 5, the intermediate carrier 6 is removed, in particular, as in FIG. 1, a carrier film is first attached.

Figure 3:
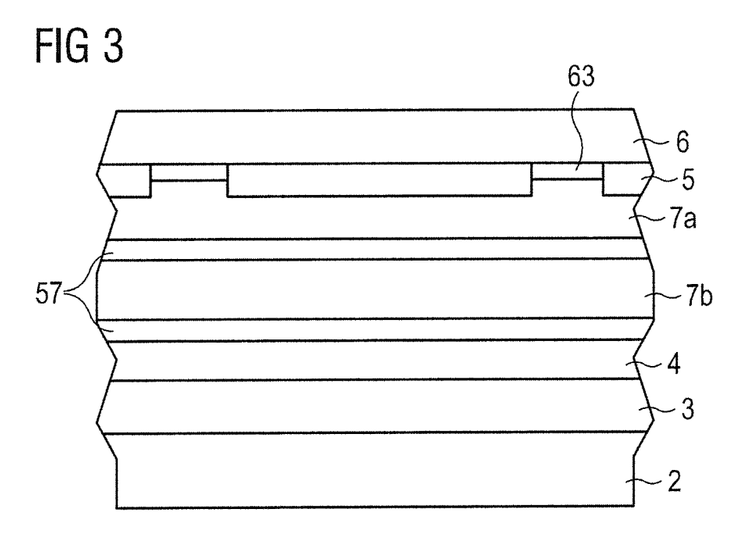

In the method as shown in connection with FIG. 3, the elevations 63 are made of a different material than the intermediate carrier 6. In particular, the elevations 63 are made of a nitride such as silicon nitride or aluminum nitride or from an oxide such as aluminum oxide or silicon oxide. The sacrificial layer 5 can be selectively etched with respect to the material of the elevations 63. According to FIG. 3, the sacrificial layer 5 has a greater thickness than the elevations 63. Therefore, the first solder layer 7a extends into the sacrificial layer 5 and up to the elevations 63.

For the rest, the method according to FIG. 3 corresponds to the method according to FIG. 2.

Figure 4:
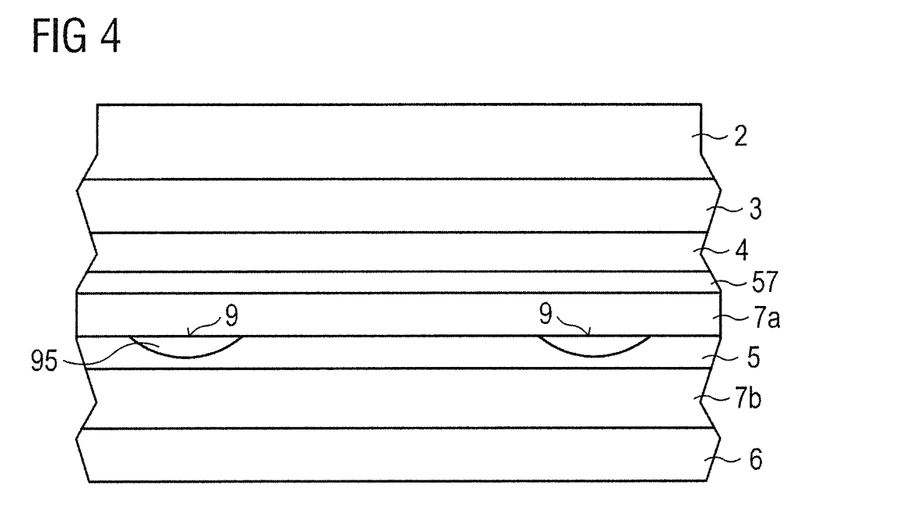

In the method as illustrated in FIG. 4, there is only one barrier layer 57 provided between the metallization 4 and the first solder layer 7a. The sacrificial layer 5 is provided directly between the two solder layers 7a and 7b. Electrical contact surfaces 9 to electrically or mechanically contact the completed semiconductor chips 1 are located on a side of the first solder layer 7a, which side faces away from the semiconductor layer sequence 3. These electrical contact surfaces 9 are covered by a cover material 95. The cover material 95 is, e.g., formed by a photo resist which may be subsequently removed by ashing.

This allows for formation of cavities, also referred to as air voids, on areas of the cover material 95. The cover material 95 can prevent a contamination of the electrical contact surfaces 9, e.g., by a material of the sacrificial layer 5. This in particular is advantageous if a material of the sacrificial layer 5 partially remains on the completed semiconductor chips 1. The sacrificial layer 5 is, e.g., dissolved as specified in connection with FIG. 1C. Alternatively, the method according to FIG. 1 may also comprise elevations, as shown in connection with FIGS. 2 and 3.

Figure 5:
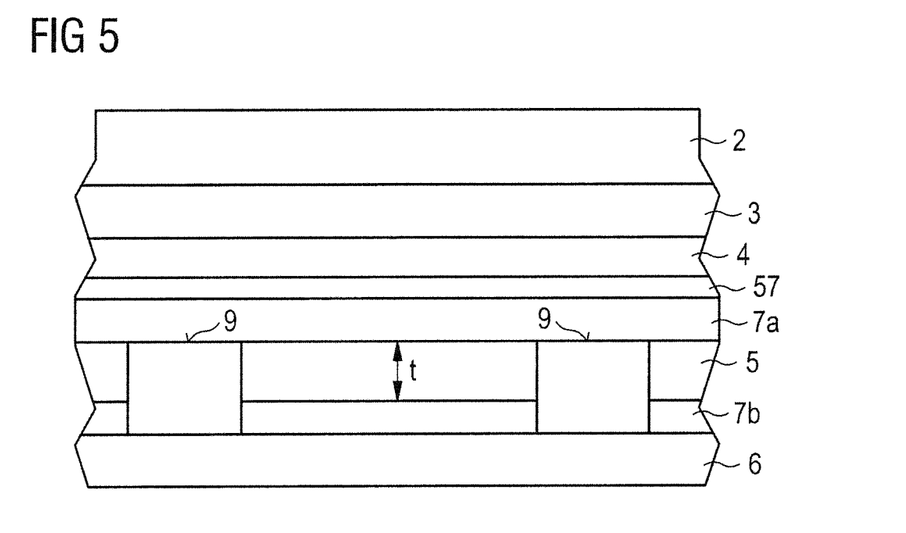

According to FIG. 5, the sacrificial layer 5 is applied in a structured way. The sacrificial layer 5 comprises a relatively great thickness t, e.g., at least 500 nm. This great thickness t of the sacrificial layer 5 prevents solder material from the second solder layer 7b, which is arranged directly at the intermediate carrier 6, from passing onto the electrical contact surfaces 9 that are not covered by the sacrificial layer 5 when attaching the intermediate carrier 6 to the semiconductor layer sequence 3. In other words, the sacrificial layer 5 serves, due to its great thickness t, as a solder-stopping layer with respect to the second solder layer 7b.

The effect of structuring the sacrificial layer 5 in FIG. 5 corresponds to employing the cover material 95 in FIG. 4. For the rest, the sacrificial layer 5 may be dissolved as shown in connection with FIG. 1C, or alternatively or additionally, the elevations 63 may be employed, as shown in connection with FIGS. 2 and 3.

The methods described herein are not limited by the description of the examples. This disclosure rather comprises each new feature as well as each combination of features, especially each combination of features in the appended claims, even though the respective feature or combination might not explicitly be specified in the claims or examples.

This application claims the priority of DE 10 2014 110 884.1, the subject matter of which is herein incorporated by reference.

The invention claimed is:

1. A method of producing optoelectronic semiconductor chips comprising:

growing a semiconductor layer sequence on a growth substrate;

applying at least one metallization to a contact side of the semiconductor layer sequence, the contact side faces away from the growth substrate;

attaching an intermediate carrier to the semiconductor layer sequence, wherein a sacrificial layer is attached between the intermediate carrier and the semiconductor layer sequence and between at least two solder layers;

removing the growth substrate from the semiconductor layer sequence;

structuring the semiconductor layer sequence into individual chip regions;

at least partially dissolving the sacrificial layer by etching; and subsequently removing the intermediate carrier such that remaining regions of the sacrificial layer are still present, wherein, removing the intermediate carrier comprises mechanically breaking the remaining regions of the sacrificial layer, the sacrificial layer is completely removed after removing the intermediate carrier, the intermediate carrier is fastened to the semiconductor layer sequence by at least one solder layer, the sacrificial layer is in direct contact with the at least one solder layer, and the sacrificial layer, immediately prior to removing the intermediate carrier, abuts, on two opposing main sides, directly to two of the at least two solder layers.

2. The method according to claim 1, wherein the chip regions are, in removing the intermediate carrier, fastened to a temporary carrier film and/or a die handler.

3. The method according to claim 1, wherein the intermediate carrier is provided with one of the at least two solder layers, the one of the at least two solder layers connects to the sacrificial layer, the at least one metallization is composed of multiple metal layers and comprises a mirror layer made of aluminum or silver, a thickness of the overall metallization is at least 70 nm and at most 500 nm, the sacrificial layer is made of a metal oxide and has a thickness of at least 0.8 μm and at most 10 μm, a thickness of the one of the at least two solder layers is at least 2 μm and at most 10 μm and is made of AuSn or NiSn, the semiconductor layer sequence, the at least one metallization, the sacrificial layer and the one of the at least two solder layers are applied to an entire surface of the growth substrate and the intermediate carrier, and after removing the growth substrate, the at least one metallization is also partitioned into the individual chip regions, and each of the chip regions is adapted for an optoelectronic semiconductor chip.

4. The method according to claim 1, wherein a plurality of elevations are either formed integrally with the intermediate carrier or the plurality of elevations are formed of a material different from the intermediate carrier and the sacrificial layer can selectively be etched with respect to the material.

5. The method according to claim 1, wherein electrical contact surfaces that externally electrically contact the completed semiconductor chip are provided on 1) a fastening side of the at least one metallization, the fastening side faces away from the semiconductor layer sequence, or provided on 2) a bottom side, facing away from the semiconductor layer sequence, of one of the at least two solder layers closest to the semiconductor layer sequence prior to removing the intermediate carrier.

6. The method according to claim 5, wherein the sacrificial layer is in some parts applied directly to the at least two solder layers forming the electrical contact surfaces or the at least one metallization, and the electrical contact surfaces are covered by a cover material before attaching the sacrificial layer such that a material of the sacrificial layer does not directly touch the electrical contact surfaces.

7. The method according to claim 6, wherein the sacrificial layer is applied in a structured manner such that the sacrificial layer, viewed in projection onto the semiconductor layer sequence, only partially extends across the semiconductor layer sequence.

8. The method according to claim 7, wherein the electrical contact surfaces are free of the sacrificial layer, and a thickness of the sacrificial layer is at least 500 nm such that in the step of attaching the carrier substrate, solder is prevented from flowing out of the at least one solder layer located on a side of the sacrificial layer, the side of the sacrificial layer faces away from the semiconductor layer sequence, onto the electrical contact surfaces.

9. The method according to claim 5, wherein the electrical contact surfaces are free of the sacrificial layer, and a thickness of the sacrificial layer is at least 500 nm such that in the step of attaching the carrier substrate, solder is prevented from flowing out of the at least one solder layer located on a side of the sacrificial layer, which side of the sacrificial layer faces away from the semiconductor layer sequence, onto the electrical contact surfaces.

10. The method according to claim 1, wherein the sacrificial layer is partially directly applied to the at least two solder layers forming the electrical contact surfaces or the at least one metallization, regions of the electrical contact surfaces remain free of the sacrificial layer, and a thickness of the sacrificial layer is at least 500 run such that in the step of attaching the carrier substrate, solder is prevented from flowing out of the at least one solder layer located on a side of the sacrificial layer, the side of the sacrificial layer faces away from the semiconductor layer sequence, onto the electrical contact surfaces.

11. The method according to claim 1, wherein the semiconductor layer sequence is based on AlInGaN, the at least one metallization comprises Ag, the intermediate carrier is provided with a solder layer, the sacrificial layer is formed of ZnO, the at least one solder layer comprises Sn and/or Au, and at least one barrier layer made of a TiW alloy is located between the sacrificial layer and the at least one metallization.

12. A method of producing optoelectronic semiconductor chips comprising:

growing a semiconductor layer sequence on a growth substrate;

applying at least one metallization to a contact side of the semiconductor layer sequence, the contact side faces away from the growth substrate;

attaching an intermediate carrier to the semiconductor layer sequence, wherein a sacrificial layer is attached between the intermediate carrier and the semiconductor layer sequence;

removing the growth substrate from the semiconductor layer sequence;

structuring the semiconductor layer sequence into individual chip regions;

at least partially dissolving the sacrificial layer by etching; and subsequently removing the intermediate carrier such that remaining regions of the sacrificial layer are still present, wherein, the removing of the intermediate carrier comprises mechanically breaking the remaining regions of the sacrificial layer, the sacrificial layer is completely removed after the removing of the intermediate carrier, the intermediate carrier is fastened to the semiconductor layer sequence by at least one solder layer, the sacrificial layer is in direct contract with the at least one solder layer, electrical contact surfaces that externally electrically contact the completed semiconductor chip are provided on 1) a fastening side of the at least one metallization, the fastening side faces away from the semiconductor layer sequence, or provided on 2) a bottom side, facing away from the semiconductor layer sequence, of one of at least two solder layers closest to the semiconductor layer sequence prior to removing the intermediate carrier, regions of the electrical contact surfaces are free of the sacrificial layer, and a thickness of the sacrificial layer is at least 500 nm such that in the step of attaching the carrier substrate, solder is prevented from flowing out of the solder layer located on a side of the sacrificial layer, the side of the sacrificial layer faces away from the semiconductor layer sequence, onto the electrical contact surfaces.

13. A method of producing optoelectronic semiconductor chips comprising:

growing a semiconductor layer sequence on a growth substrate;

applying at least one metallization to a contact side of the semiconductor layer sequence, the contact side faces away from the growth substrate;

attaching an intermediate carrier to the semiconductor layer sequence, wherein a sacrificial layer is attached between the intermediate carrier and the semiconductor layer sequence;

removing the growth substrate from the semiconductor layer sequence;

structuring the semiconductor layer sequence into individual chip regions;

at least partially dissolving the sacrificial layer by etching; and subsequently removing the intermediate layer such that remaining regions of the sacrificial layer are still present, wherein, the removing of the intermediate carrier comprises mechanically breaking the remaining regions of the sacrificial layer, the sacrificial layer is completely removed after the removing of the intermediate carrier, the intermediate carrier is fastened to the semiconductor layer sequence by at least one solder layer, the sacrificial layer is in direct contact with the at least one solder layer, electrical contact surfaces that externally electrically contact the completed semiconductor chip are provided on 1) a fastening side of the at least one metallization, the fastening side faces away from the semiconductor layer sequence, or provided on 2) a bottom side, facing away from the semiconductor layer sequence, of one of at least two solder layers closest to the semiconductor layer sequence prior to removing the intermediate carrier, the electrical contact surfaces are covered by a cover material before attaching the sacrificial layer such that a material of the sacrificial layer does not directly touch the electrical contact surfaces, the sacrificial layer is applied in a structured manner such that the sacrificial layer, viewed in projection onto the semiconductor layer sequence, only partially extends across the semiconductor layer sequence, the electrical contact surfaces are free of the sacrificial layer, and a thickness of the sacrificial layer is at least 500 nm such that in the step of attaching the carrier substrate, solder is prevented from flowing out of the at least one solder layer located on a side of the sacrificial layer, the side of the sacrificial layer faces away from the semiconductor layer sequence, onto the electrical contact surfaces.

* * * * *